(12) United States Patent
Lutz et al.

(10) Patent No.: US 9,608,662 B2
(45) Date of Patent: Mar. 28, 2017

(54) APPARATUS AND METHOD FOR CONVERTING FLOATING-POINT OPERAND INTO A VALUE HAVING A DIFFERENT FORMAT

(71) Applicant: ARM Limited, Cambridge (GB)

(72) Inventors: David Raymond Lutz, Austin, TX (US); Neil Burgess, Austin, TX (US)

(73) Assignee: ARM Limited, Cambridge (GB)

( * ) Notice: Subject to any disclaimer, the term of this patent is extended or adjusted under 35 U.S.C. 154(b) by 243 days.

(21) Appl. No.: 14/498,118

(22) Filed: Sep. 26, 2014

(65) Prior Publication Data
US 2016/0092168 A1  Mar. 31, 2016

(51) Int. Cl.
G06F 5/01 (2006.01)
H03M 7/24 (2006.01)

(52) U.S. Cl.
CPC .................................... *H03M 7/24* (2013.01)

(58) Field of Classification Search
None
See application file for complete search history.

(56) References Cited

U.S. PATENT DOCUMENTS

| | | |
|---|---|---|
| 3,930,232 A | 12/1975 | Wallach et al. |
| 6,249,798 B1 | 6/2001 | Golliver et al. |
| 7,401,107 B2 | 7/2008 | Lutz et al. |
| 7,774,393 B1 * | 8/2010 | Brooks .................... H03M 7/24 708/204 |
| 2011/0279692 A1 | 11/2011 | Hirayama |
| 2012/0215822 A1 * | 8/2012 | Nystad ..................... G06F 7/483 708/204 |
| 2016/0092168 A1 * | 3/2016 | Lutz ........................ G06F 5/00 708/204 |
| 2016/0092169 A1 * | 3/2016 | Lutz ........................ G06F 7/485 708/205 |

OTHER PUBLICATIONS

UK Combined Search and Examination Report dated Mar. 9, 2016 issued in GB 1513897.7, 6 pages.
"IEEE Standard for Floating-Point Arithmetic" IEEE Computer Society, IEEE Std 754™-2008, Aug. 2008, 70 pages.
U.S. Appl. No. 14/498,172, filed Sep. 26, 2014, Lutz et al.
Office Action mailed Jul. 5, 2016 in co-pending U.S. Appl. No. 14/498,172, 9 pages.
UK Examination Report dated Oct. 7, 2016 issued in GB 1513897.7, 3 pages.

* cited by examiner

*Primary Examiner* — David H Malzahn
(74) *Attorney, Agent, or Firm* — Nixon & Vanderhye P.C.

(57) ABSTRACT

A data processing apparatus has floating-point add circuitry to perform a floating-point addition operation for adding or subtracting two floating-point values. The apparatus also has conversion circuitry to perform a conversion operation to convert a first floating-point value into a second value having a different format. The conversion circuitry is capable of converting to an integer or fixed-point value. The conversion circuitry is physically distinct from the floating-point add circuitry.

15 Claims, 6 Drawing Sheets

1st operand:

| 53-b significand | | 11 zeroes | DP operand |
| 24-b significand | 40 zeroes | | SP operand |
| 11-b signf'd | 53 zeroes | | HP operand |

2nd operand:

| 40 zeroes | 24-b significand | SP result |
| 53 zeroes | 11-b signf'd | HP result |
| 64-b integer / fixed point | | 64-b int result |
| 32 zeroes | 32-b integer / fixed point | 32-b int result |
| 48 zeroes | 16-b int / fx-pt | 16-b int result |

APPARATUS AND METHOD FOR CONVERTING FLOATING-POINT OPERAND INTO A VALUE HAVING A DIFFERENT FORMAT

BACKGROUND

Technical Field

The present technique relates to the field of data processing. More particularly, it relates to a conversion operation for converting a floating-point value into a value of a different format.

Background

A data processing apparatus may support values of a number of different formats. For example, values may have a floating-point format, in which the value is represented by a significand representing the significant bits of the value and an exponent representing the position of a radix point relative to the significand. Also, a value may have an integer format, representing an integer value with no fractional bits, or a fixed-point format, representing a numeric value using a fixed number of integer-valued bits and a fixed number of fractional-valued bits. In an apparatus supporting more than one format, it may be desirable to convert between the different formats and so a conversion operation may be performed. The present technique seeks to provide an improved apparatus and method for converting from a floating-point value to a value of a different format.

SUMMARY

Viewed from one aspect, the present technique provides a data processing apparatus comprising: floating-point add circuitry to perform a floating-point addition operation for adding or subtracting two floating-point values to generate a result floating-point value; and conversion circuitry to perform a conversion operation to convert a first floating-point value into a second value having a different format to the first floating-point value; wherein the conversion circuitry is capable of performing the conversion operation where the second value is an integer value or a fixed-point value; and the conversion circuitry is physically distinct from the floating-point add circuitry.

Viewed from another aspect, the present technique provides a data processing apparatus comprising: floating-point adding means for performing a floating-point addition operation for adding or subtracting two floating-point values to generate a result floating-point value; and conversion means for performing a conversion operation to convert a first floating-point value into a second value having a different format to the first floating-point value; wherein the conversion means is capable of performing the conversion operation where the second value is an integer value or a fixed-point value; and the conversion means is physically distinct from the floating-point add means.

Viewed from a further aspect, the present technique provides a data processing method comprising: performing a conversion operation to convert a first floating-point value into a second value having a different format to the first floating-point value; wherein the conversion operation is performed using conversion circuitry which is physically distinct from floating-point add circuitry for performing a floating-point addition operation for adding or subtracting two floating-point values to generate a result floating-point value; and the conversion circuitry is capable of performing the conversion operation where the second value is an integer value or fixed-point value.

The above, and other objects, features and advantages will be apparent from the following detailed description of illustrative embodiments which is to be read in connection with the accompanying drawings.

DESCRIPTION OF EXAMPLE EMBODIMENTS

Figure 1:
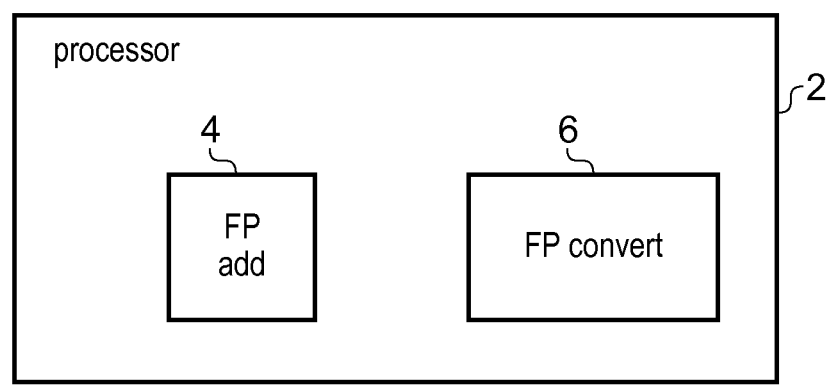
FIG. 1 schematically illustrates an example of a data processing apparatus having floating-point add circuitry and conversion circuitry for converting a floating-point value into a value of a different format.

A data processing apparatus has floating-point add circuitry and conversion circuitry which are physically distinct from each other. This differs from typical systems which usually use the floating-point add circuitry to perform a conversion operation to convert a first floating-point value into a second value having a different format. However, combining both operations in a single unit slows down both of the add operation and the conversion operation and also requires more circuit area then providing two separate units. By providing a physically separate (standalone) conversion circuitry dedicated to performing the conversion operation, including conversion operations to convert the floating-point value to integer or fixed-point values, circuit area can be decreased and performance improved. This is particularly effective for devices supporting conversion from floating-point to fixed-point or integer values, because these conversions cause added complexity in handling negative values, which would be slow to implement within an add unit.

By providing a separate conversion circuitry, it is possible to perform the conversion operation in fewer processing cycles than are required for the floating-point addition operation. In contrast, if the same unit was used for both operations, the conversion operation would take the same number of cycles as the addition, unnecessarily slowing down the conversion operation.

As well as converting to integer or fixed-point values, the conversion operation may also be capable of converting the first floating-point value into a second floating-point value having a different format the first floating-point value. More particularly, the conversion circuitry may convert the first floating-point value into a second floating-point value having a significand with fewer bits than the first floating-point value. Conversions to a smaller floating-point format or to integer or fixed-point values are typically tricky because they often require rounding in order to represent the value indicated by the first floating-point value within the format of the second value. By providing conversion circuitry separate from the floating-point add circuitry, the rounding circuitry provided in the conversion circuitry can be designed specifically for this operation, so that it can be faster than if general rounding circuitry in the adder was used. If the conversion operation supports conversions to another floating-point value, then exponent generating circuitry may be provided to convert an exponent of the first floating-point value into an exponent of the second floating-point value.

When converting to a smaller floating-point format, some values which can be represented using a normal floating-point value in the first format may correspond to a subnormal value in the second format. Hence, the conversion circuitry may be capable of generating the second floating-point value with subnormal values as well as normal values. By providing the ability to generate subnormal results, this extends the range of values for which the conversion circuitry can be used.

The conversion circuitry may comprise shift circuitry to shift the significand of the first floating-point value by a shift amount which depends on the format of the first floating-point value and the format of the second value, to generate a shifted significand. While some embodiments may only implement one type of conversion, and so may always shift the significand by the same amount, it may be desirable to support two or more different types of conversions. In this case, then the conversion circuitry may have shift control circuitry which determines the shift amount based on at least one control parameter which specifies one or both of the formats of the first and second values. For example, a conversion instruction which triggers the conversion circuitry to perform the conversion operation may specify the at least one control parameter for controlling the shift control circuitry to determine the appropriate shift amount.

There may also be other factors which are used to determine the shift amount. If converting the first value to a second floating-point value and the first floating-point value is smaller than the minimum value representable as a normal value in the format of the second floating-point value, then a subnormal result may be generated as discussed above, and in this case, the shift amount may also be determined based on the exponent of the first floating-point value. Also, if the second value is a fixed-point value then the shift control circuitry may determine the shift amount based on a parameter representing the position of a radix point within the second value.

The conversion circuitry may comprise inverting circuitry to invert the significand of the first floating-point value or the output of the shift circuitry if the first floating-point value represents a negative value and the second value is a fixed-point or integer value. Floating-point values are represented using sign-magnitude representation, while fixed-point or integer values are represented using two's complement representation. Therefore, when converting between floating-point values and fixed-point or integer values, an inversion may be applied to preserve the sign of the value.

As mentioned above, rounding may be required if the first floating-point value cannot be exactly represented by the second value. Hence, the conversion circuitry may comprise rounding circuitry to round the output of the shift circuitry to a value that is representable in the format of the second value. For example, the rounding circuitry may have rounding control circuitry which determines a rounding increment, and an adder to add the rounding increment to the shifted significand generated by the shifter, in order to generate the significand of the second value. The rounding increment may be determined according to any desired rounding mode. In some implementations, several different rounding modes may be supported, in which case the rounding control circuitry may set the rounding increment in different ways depending on the currently selected rounding mode. For example, the rounding mode may be specified by the instruction executed to cause the conversion circuitry to perform the conversion operation, or may be indicated in a register.

As mentioned above, if the first floating-point value represents a negative value and the second value is a fixed-point or integer value, then an inversion may be applied to preserve the sign of the value. For example, the inversion may be applied at the output of the shifter so that first the significand of the first floating-point value is shifted by the determined shift amount, and then a inversion is applied if the first floating-point value is negative, before adding the rounding increment. In typical systems, when rounding one would wait for the final numeric result, before determining the rounding increment to be added to the result to round if necessary. However, changing the output of the shift circuitry to two's complement format takes a significant fraction of a cycle, and so waiting until this is complete before determining the rounding increment may increase the number of cycles required to carry out the conversion operation. To speed up the conversion operation, the rounding increment can be determined based on a non-inverted output of the shift circuitry, and then the rounding increment can be added to the inverted version of the shifted significand. That is, the rounding increment for rounding the inverted version of the shifted significand can be predicted before the conversion to two's complement format is actually complete. This would not be possible if the conversion operation was performed within a floating-point add unit, in which the rounding would be provided at the final stage after all other processing has completed. Also, while generating the two's complement to obtain the corresponding negative value would normally require inverting the value and then adding 1, the addition of 1 can effectively be incorporated into the determination of the rounding increment, so that fewer adding steps are required. In this way, the conversion operation can be performed using fewer processing cycles.

Floating-Point Representation

Floating-point (FP) is a useful way of approximating real numbers using a small number of bits. The IEEE 754-2008 FP standard proposes multiple different formats for FP numbers. For example, three formats are binary 64 (also known as double precision, or DP), binary 32 (also known as single precision, or SP), and binary 16 (also known as half precision, or HP). The numbers 64, 32, and 16 refer to the number of bits required for each format.

FP numbers are quite similar to the "scientific notation" taught in science classes, where instead of negative two million we'd write $-2.0 \times 10^6$. The parts of this number are the sign (in this case negative), the significand (2.0), the base of the exponent (10), and the exponent (6). All of these parts have analogs in FP numbers, although there are differences, the most important of which is that the constituent parts are stored as binary numbers, and the base of the exponent is always 2. More precisely, FP numbers all consist of a sign bit, some number of biased exponent bits, and some number of fraction bits. For example, some floating-point formats include:

| Format | sign | Exponent | fraction | exponent bias |
|---|---|---|---|---|
| DP [63:0] | 63 | 62:52 (11 bits) | 51:0 (52 bits) | 1023 |
| SP [31:0] | 31 | 30:23 (8 bits) | 22:0 (23 bits) | 127 |
| HP [15:0] | 15 | 14:10 (5 bits) | 9:0 (10 bits) | 15 |

The sign is 1 for negative numbers and 0 for positive numbers. Every number, including zero, has a sign.

The exponent is biased, which means that the true exponent differs from the one stored in the number. For example, biased SP exponents are 8-bits long and range from 0 to 255. Exponents 0 and 255 are special cases, but all other exponents have bias 127, meaning that the true exponent is 127 less than the biased exponent. The smallest biased exponent is 1, which corresponds to a true exponent of −126. The maximum biased exponent is 254, which corresponds to a true exponent of 127. HP and DP exponents work the same way, with the biases indicated in the table above.

SP exponent 255 (or DP exponent 2047, or HP exponent 31) is reserved for infinities and special symbols called NaNs (not a number). Infinities (which can be positive or negative) have a zero fraction. Any number with exponent 255 and a nonzero fraction is a NaN. Infinity provides a saturation value, so it actually means something like "this computation resulted in a number that is bigger than what we can represent in this format." NaNs are returned for operations that are not mathematically defined on the real numbers, for example division by zero or taking the square root of a negative number.

Exponent zero, in any of the formats, is reserved for subnormal numbers and zeros. A normal number represents the value:

$$\text{sign} \times 1.\text{fraction} \times 2^e$$

where e is the true exponent computed from the biased exponent. The term 1.fraction is called the significand, and the 1 is not stored as part of the FP number, but is instead inferred from the exponent. All exponents except zero and the maximum exponent indicate a significand of the form 1.fraction. The exponent zero indicates a significand of the form 0.fraction, and a true exponent that is equal to 1-bias for the given format. Such a number is called subnormal (historically these numbers were referred to as denormal, but modern usage prefers the term subnormal). Numbers with both exponent and fraction equal to zero are zeros.

The following table has some example numbers in HP format. The entries are in binary, with '_' characters added to increase readability. Notice that the subnormal entry (4th line of the table, with zero exponent) produces a different significand than the normal entry in the preceding line.

| sign | 5-bit exponent | 10-bit fraction | 11-bit significand | value |
|---|---|---|---|---|
| 0 | 01111 | 00_0000_0000 | 100_0000_0000 | $1.0 \times 2^0$ |
| 1 | 01110 | 10_0000_0000 | 110_0000_0000 | $-1.1 \times 2^{-1}$ |
| 0 | 00001 | 10_0000_0000 | 110_0000_0000 | $1.1 \times 2^{-14}$ |
| 0 | 00000 | 10_0000_0000 | 010_0000_0000 | $0.1 \times 2^{-14}$ |
| 1 | 11111 | 00_0000_0000 | | −infinity |
| 0 | 11111 | 00_1111_0011 | | NaN |

A large part of the complexity of FP implementation is due to subnormals, therefore they are often handled by microcode or software. However, by handling subnormals in hardware (as in the ARM® Cortex® processors provided by ARM Limited for example), speeding up these operations by a factor of 10 to 100 compared to a software or microcode implementation.

Integers, Fixed-Point, Floating-Point

The FP way of handling signs is called sign-magnitude, and it is different from the usual way integers are stored in the computer (two's complement). In sign-magnitude representation, the positive and negative versions of the same number differ only in the sign bit. A 4-bit sign-magnitude integer, consisting of a sign bit and 3 significand bits, would represent plus and minus one as:

+1=0001 −1=1001

In two's complement representation, an n-bit integer i is represented by the low order n bits of the binary n+1-bit value $2^n+i$, so a 4-bit two's complement integer would represent plus and minus one as:

+1=0001 −1=1111

The two's complement format is practically universal for signed integers because it simplifies computer arithmetic.

A fixed-point number looks exactly like an integer, but actually represents a value that has a certain number of fractional bits. Sensor data is often in fixed-point format, and there is a great deal of fixed-point software that was written before the widespread adoption of FP. Fixed-point numbers are quite tedious to work with because a programmer has to keep track of the "binary point", i.e. the separator between the integer and fractional parts of the number, and also has to constantly shift the number to keep the bits in the correct place. FP numbers don't have this difficulty, so it is desirable to be able to convert between fixed-point numbers and FP numbers. Being able to do conversions also means that we can still use fixed-point software and data, but we are not limited to fixed-point when writing new software.

Rounding

Most FP operations are required by the IEEE-754 standard to be computed as if the operation were done with unbounded range and precision, and then rounded to fit into an FP number. If the computation exactly matches an FP number, then that value is always returned, but usually the computation results in a value that lies between two consecutive floating-point numbers. Rounding is the process of picking which of the two consecutive numbers should be returned. There are a number of ways of rounding, called rounding modes; six examples of these are as follows:

| Mode | | definition |
|---|---|---|
| RNE | round-to nearest, ties to even | pick the closest value, or if both values are equally close then pick the even value |
| RNA | round to nearest, ties to away | pick the closest value, or if both values are equally close then pick the value farthest away from zero |
| RZ | round to zero | pick the value closest to zero |
| RP | round to plus infinity | pick the value closest to plus infinity |
| RM | round to minus infinity | pick the value closest to minus infinity |
| RX | round to odd | pick the odd value |

The definition doesn't tell us how to round in any practical way. One common implementation is to do the operation, look at the truncated value (i.e. the value that fits into the FP format) as well as all of the remaining bits, and then adjust the truncated value if certain conditions hold. These computations are all based on:

L—(least) the least significant bit of the truncated value
G—(guard) the next most significant bit (i.e. the first bit not included in the truncation)
S—(sticky) the logical OR of all remaining bits that are not part of the truncation Given these three values and the truncated value, we can always compute the correctly rounded value according to the following table:

| mode | change to the truncated value |
|---|---|
| RNE | increment if (L&G) | (G&S) |
| RNA | increment if G |

| mode | change to the truncated value |
|------|-------------------------------|
| RZ | none |
| RP | increment if positive & (G|S) |
| RM | increment if negative & (G|S) |
| RX | set L if G|S |

For example, consider multiplying two 4-bit significands, and then rounding to a 4-bit significand.

sig1=1001 (decimal 11) sig2=0111 (decimal 7)
multiplying yields
sig1×sig2=1001_101 (decimal77) L Gss The least significant bit of the truncated 4-bit result is labeled L, the next bit G, and S is the logical OR of the remaining bits labeled s (i.e. S=0|1=1). To round, we adjust our 4-bit result (1001) according to the rounding mode and the computation in the table above. So for instance in RNA rounding, G is set so we return 1001+1=1010. For RX rounding G|S is true so we set L to 1 (it's already 1, so in this case nothing changes) and return 1001.

Rounding Integer and Fixed-Point Numbers

If we convert an FP number to integer or fixed-point we also have to round. The concept is basically the same as FP rounding. An FP number that happens to be an integer always rounds to that integer. All other FP numbers lie between two consecutive integers, and rounding dictates which integer is returned. Unfortunately the rounding logic for integers is somewhat harder because of the differences between two's complement and sign-magnitude form. Incrementing a sign-magnitude number always increases the magnitude, so the incremented number is farther away from zero. The same thing happens for positive two's complement numbers, but negative two's complement numbers become closer to zero when incremented. This means that the rounding logic has to change based on whether the integer is positive or negative. It also means we have to be careful in picking the base value (the value which will be incremented or not). For positive integers, that value is just the truncated FP significand, so 1.37 will have a base value of 1, and a result of either 1 or 2. For negative integers, we again truncate the significand and take the one's complement of the result (one's complement is the original number with all bits inverted), −1.37 is truncated to 1 and then inverted, giving a base value of −2. Everything then works out since we want our result to be either −2 or (when incremented) −1.

FIG. 1 schematically illustrates an example of a data processing apparatus 2, e.g. a processor in this example. The processor has a floating-point add unit 4 for performing floating-point addition or subtraction operations, and a separate floating-point conversion unit 6 for performing conversion operations to convert a first floating-point value into a second value with a different format. The second value may be another floating-point value, an integer value or a fixed-point value. In the examples discussed below, the conversion circuitry 6 supports all of these types of values, but it will be appreciated that only a subset of the second value types may be supported for a given floating-point conversion unit 6. The floating-point add unit 4 and floating-point conversion unit 6 are physically distinct so that separate circuits are provided. This means that each of the unit 4, 6 can be optimised for their particular operation, so that both the addition and the conversion can be performed faster than would be the case if these were combined in a single add unit. Any known floating-point add unit design may be used for the add unit 4. It will be appreciated that the apparatus 2 may include many other elements not illustrated in FIG. 1 for conciseness.

Figures 2, 3, 4:
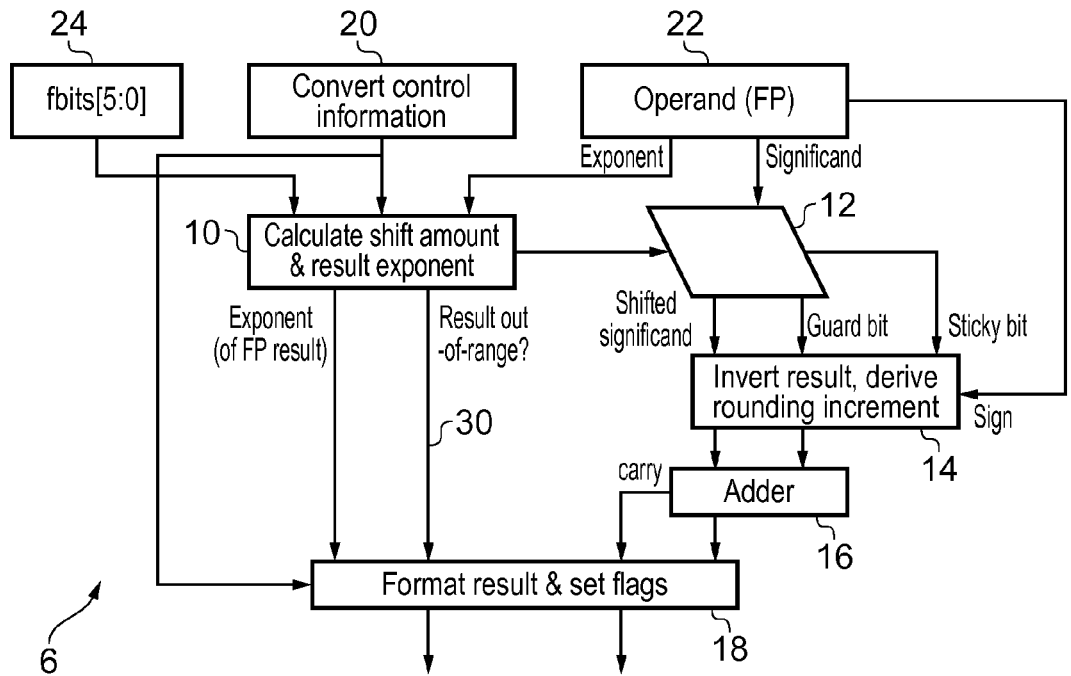
FIG. 2 shows an example of the conversion circuitry.
FIG. 3 shows examples of formats of a floating-point value to be converted by the conversion circuitry.
FIG. 4 illustrates examples of formats of the second value to be generated by the conversion circuitry.

FIG. 2 shows an example of circuitry provided in the floating-point conversion unit 6. The conversion unit 6 includes a first adder 10, a right shifter 12, control circuitry 14 (including inverting circuitry and rounding control circuitry), a second adder 16 and result formatting circuitry 18. The first adder is an integer adder, separate from the floating-point add unit 4 shown in FIG. 1.

The first floating-point value is placed in a register 22. A 3-input multiplexer selects the appropriate 64 bits to be input to the right shifter 12, according to one of the formats shown in FIG. 3. In these examples, the significand of the first floating-point value is placed in the most significant portion of the input value and any remaining bits are padded with zeros. By placing the significand of the first floating-point value at the most significant portion of the value input to the shifter 12 regardless of the floating-point format used for the first floating-point value, this simplifies the calculation of the shift amount to be applied by the shifter 12 to convert the first value to the second value. However, other value formats could also be supported.

FIG. 4 shows different examples of second value formats that can be generated by the conversion circuitry. It will be appreciated that other formats could also be supported. The top two rows of FIG. 4 show examples where the second value is another floating-point value with a smaller significand than the first value (e.g. single or half precision compared to double or single precision for the first value). The last three examples show 64-bit, 32-bit and 16-bit fixed-point or integer values. If a fixed-point value is to be generated, a radix position parameter 24 is input to the first adder 10 as shown in FIG. 2, to indicate the number of fractional bits in the fixed-point value.

As shown in FIG. 2, the first adder 10 is for calculating the shift amount to be applied by the right shifter 12 and, in the case where the first value is converted to a second floating-point value, for calculating the exponent of the second value. The first adder 10 receives the exponent of the first value, conversion control information 20 specifying the formats of the first and second values, and the radix position parameter 24. The conversion control information 20 may for example be derived from one or more parameters specified by the instruction executed to cause the conversion unit 6 to perform the conversion operation. In other examples the conversion control information may be read from registers.

The first adder 10 calculates the shift amount according to the type of conversion. Generally speaking, for floating-point to floating-point conversions, the shift amount is msb_position(src)−msb_position(dst). Given that the value has been aligned as shown above, the shift distances for normalized results are:

40 if converting to a normalized SP result
53 if converting to a normalized HP result However, for subnormal results, msb_position(dst) is given by the value of the unbiased exponent. Therefore, the shift amount for subnormal results is given by: msb_position(src)−unbiased_exp(src)=msb_position(src)−(biased_exp(src)−bias(src)) where bias[5:0] for DP and SP numbers is 6'b3f (although the bias amount is different for DP and SP, only the lower 6 bits [5:0] are required for this calculation, and these bits are the same for both DP and SP). Given that the value has been left-aligned as shown above, the shift distances for normalized results become:

42+~exp[5:0] if converting to an SP subnormal result (i.e. −149≤unbiased_exp≤−127)

55+~exp[5:0] if converting to an HP subnormal result (i.e. −25≤unbiased_exp≤−15)

(the notation "~" in ~exp[5:0] indicates that bits [5:0] of the exponent are inverted).

For floating-point to integer or fixed-point conversions, the shift amount is again msb_position(src)−msb_position(dst), but now the msb position of the destination is the unbiased exponent modified by the value of fbits[5:0], which effectively left-shifts the result by inserting a binary point into the destination. Thus the shift amount is expressed as:

~exp[5:0]−fbits+bias(src)=~exp[5:0]+immv+bias(src)

where immv is an immediate value that encodes the value of fbits as size(dst)−fbits, where size(dst) is the total number of bits in the result.

Also as part of this step, the exponent of normalized floating-point results is obtained by the first adder 10, by adjusting the bias of the exponent from that of the source operand format to that of the destination format. The adjustment is a constant that depends only on the formats of source operand and the destination. For DP to SP conversion, the constant is −(1023−127)=−896; for DP to HP, the constant is −(1023−15)=−1008; and for SP to HP, the constant is −(127−15)=−112.

The right shifter 12 right shifts the first value supplied from register 22 by a number of bits specified by the shift amount calculated by the first adder 10. As well as a 64-bit shifted significand, the right shifter 12 also outputs a guard bit (representing the bit value one place below the least significant bit of the 64-bit output) and a sticky bit determined by progressively combining all the bits that are right shifted past the guard bit of the result by a logical OR operation. The shifted significand is provided to the control circuitry 14 together with the guard bit (G) and the sticky bit (S), and the sign bit of the first value is also provided to the control circuitry 14.

When converting from a floating-point value to an integer or a fixed-point value, if the first value is negative, the control circuitry 14 inverts the shifted significand generated by the shifter. This is because floating-point values are represented using sign-magnitude format while the fixed-point or floating-point value would be returned in two's complement format, so a given pattern of bits in a negative floating-point value would represent a positive value in the two's complement, so an inversion is required to preserve the same numeric value (while finding the two's complement value would normally require an addition of 1 following the inversion, as described below this can be considered as part of the rounding increment determination).

The control circuitry 14 includes rounding control circuitry which determines a rounding increment to the added to the output of the shifter 12 in order to round the first value to a value representable using the format of the second value. If the first value is positive, or is being converted to another floating-point value, then the rounding increment is determined based on L, G and S, according to the rules set out in the table in the section headed "Rounding" above.

If the second value is an integer or a fixed-point value, and the first floating-point value is negative, correct rounding would require us to complete the two's complement process (invert and add 1) and then compute L, G, and S before rounding as for positive values. However, adding that 1 is slow compared to just inverting. Ideally we would like to compute the actual L, G, and S from the original shifted input (i.e., from the input before we've done anything about signs, such as inverting). So the floating-point 1.37 or −1.37 would both be right shifted to the integer 1. This can be done by adjusting the calculation of the L, G and S bits for negative values, as follows.

Let L0, G0, and S0 be the least significant bit (lsb), guard and sticky before inverting, and let Li, Gi, and Si be lsb, guard and sticky after inverting, and finally let L, G, and S be the lsb, guard and sticky after inverting and adding 1.

If S0 is zero, then the bits contributing to Si are all ones, and hence S (obtained by adding 1 to those Si bits) is also zero. If S0 is nonzero, then Si is not all ones, and hence S is nonzero. So in all cases S0=S.

If G0 is zero, then Gi is 1, and G is also one except for the case when there is a carry-in from the S bits, which only happens when S0 is zero. If G0 is 1, then Gi is zero, and again G is also 1 except for the case where there is a carry-in from the S bits, which only happens when S0 is zero. So G=G0 ^ S0 (^ represents XOR).

By very similar logic, L=L0 ^ (G0|S0). (^ represents XOR and | represents OR).

Hence, for positive values of the first value, the rounding increment is determined based on L0, G0 and S0 as output by the shifter 12. For negative values, the rounding increment is determined based on modified values as follows: S=S0, G=(G0 ^ S0), L=(L0 ^ (G0|S0)).

Now that we have L, G, and S for both negative and positive integers, we can come up with our rounding rules:

TABLE 1

| mode | change to a positive value | change to a negative value |
|------|---------------------------|----------------------------|
| RNE  | increment if (L&G) | (G&S) | increment if (L&G) | (G&S) |
| RNA  | increment if G            | increment if (G&S)         |
| RZ   | none                      | increment if (G|S)         |
| RP   | increment if (G|S)        | increment if (G|S)         |
| RM   | none                      | none                       |
| RX   | set L if G|S              | set L if G|S               |

Fixed-point numbers round exactly the same way as integers. The rules for unsigned conversions (to integer or fixed-point) are the same as the rules for positive conversions.

By determining the rounding increment in this way, the rounding increment can be determined without performing the two's complement conversion, thus avoiding a second carry-propagate addition. This helps to speed up the conversion operation. Also, the addition of 1 for finding the two's complement of the shifted value is folded into to the rounding increment determination, to reduce the number of additions required, which saves a processing step.

The second adder 16 then adds the rounding increment of 0 or 1 to the shifted significand or inverted shifted significand. The result of the adder 16 is provided to result formatting circuitry 18 together with a carry output of the adder 16. The result formatting circuitry 18 then formats the results so that the significand is placed at the least significant end of an output register as shown in FIG. 4, and also sets condition flags based on the carry output of the adder 16 and a control signal 30 output by the first adder 10 indicating whether the results is out of the range which can be represented using the second format. This enables overflow or other condition flags to be set which may be used by subsequent conditional instructions.

Figure 5:
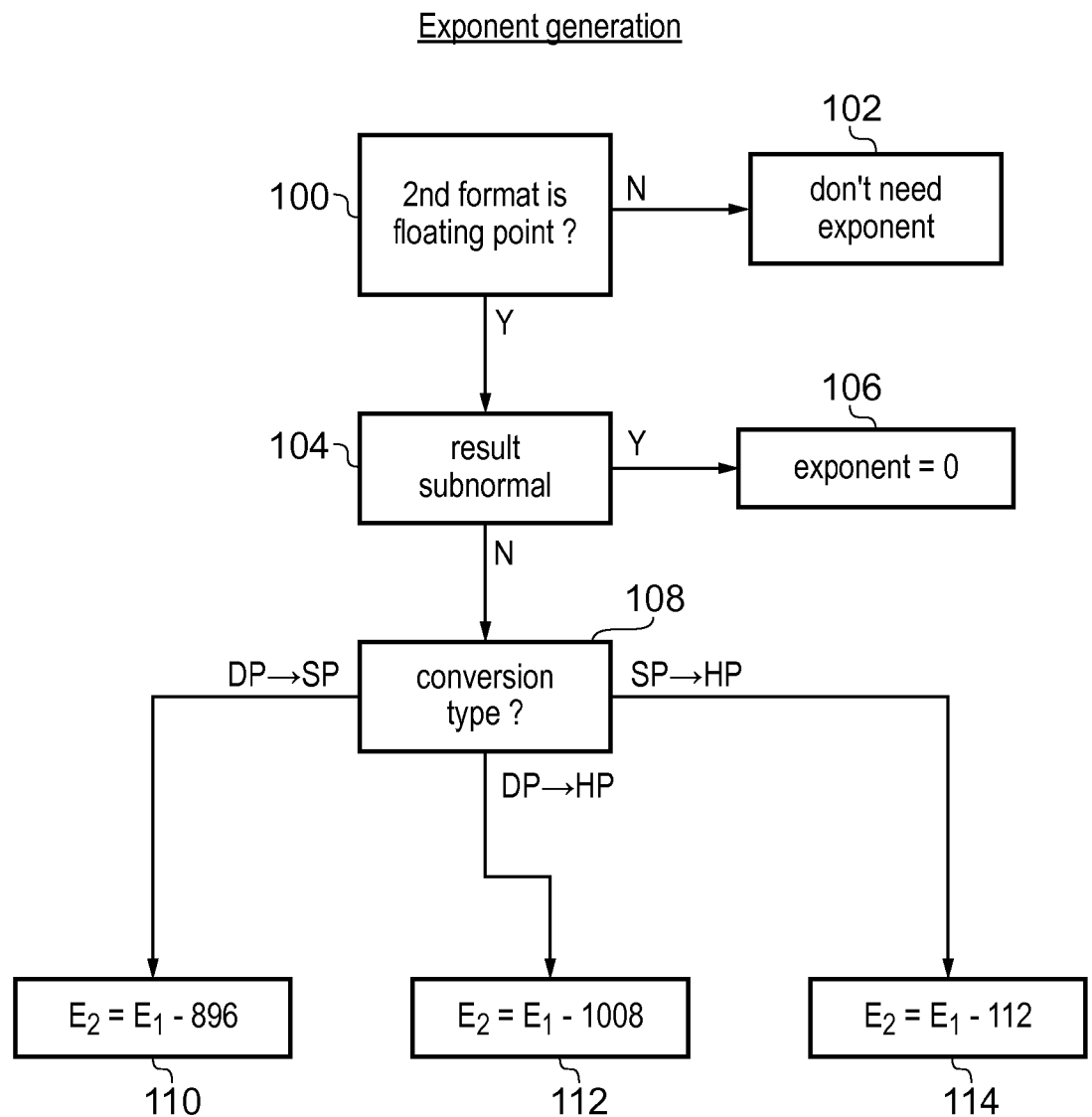
FIG. 5 is a flow diagram illustrating an example of generating an exponent if the second value is a floating-point value.

FIG. 5 is a flow diagram showing how the first adder 10 may generate the exponent of the second value when the first value is converted to another floating-point format. At step 100 it is checked whether the second format is a floating-point format, and if not then at step 102 it is determined that no exponent is required. If the second format is a floating-point format then at step 104 it is determined whether the result will be subnormal. For floating-point conversions from a larger format to a smaller format, even if the input value is normal, in the smaller format the same value may be subnormal. When converting to single precision, this will be the case if the unbiased exponent of the first value is between −149 and −127, while when converting to half precision then the result will be subnormal if the unbiased exponent is between −25 and −15. If the result will be subnormal, then at step 106 the first adder 10 generates a result exponent of 0 to indicate a subnormal result.

On the other hand, if the result will be a normal floating-point value then at step 108 the type of conversion is determined. If the conversion is from double precision to single precision then at step 110 the exponent of the second value is set equal to the exponent of the first value minus 896. If the conversion is from double precision to half precision then at step 112 the exponent of the second value is set equal to the exponent of the first value minus 1008. If the conversion is single precision to half precision, then at step 114 the exponent of the second value is set equal to the exponent of the first value minus 112. These adjustments reflect the change in bias amounts between the different formats.

Figure 6:
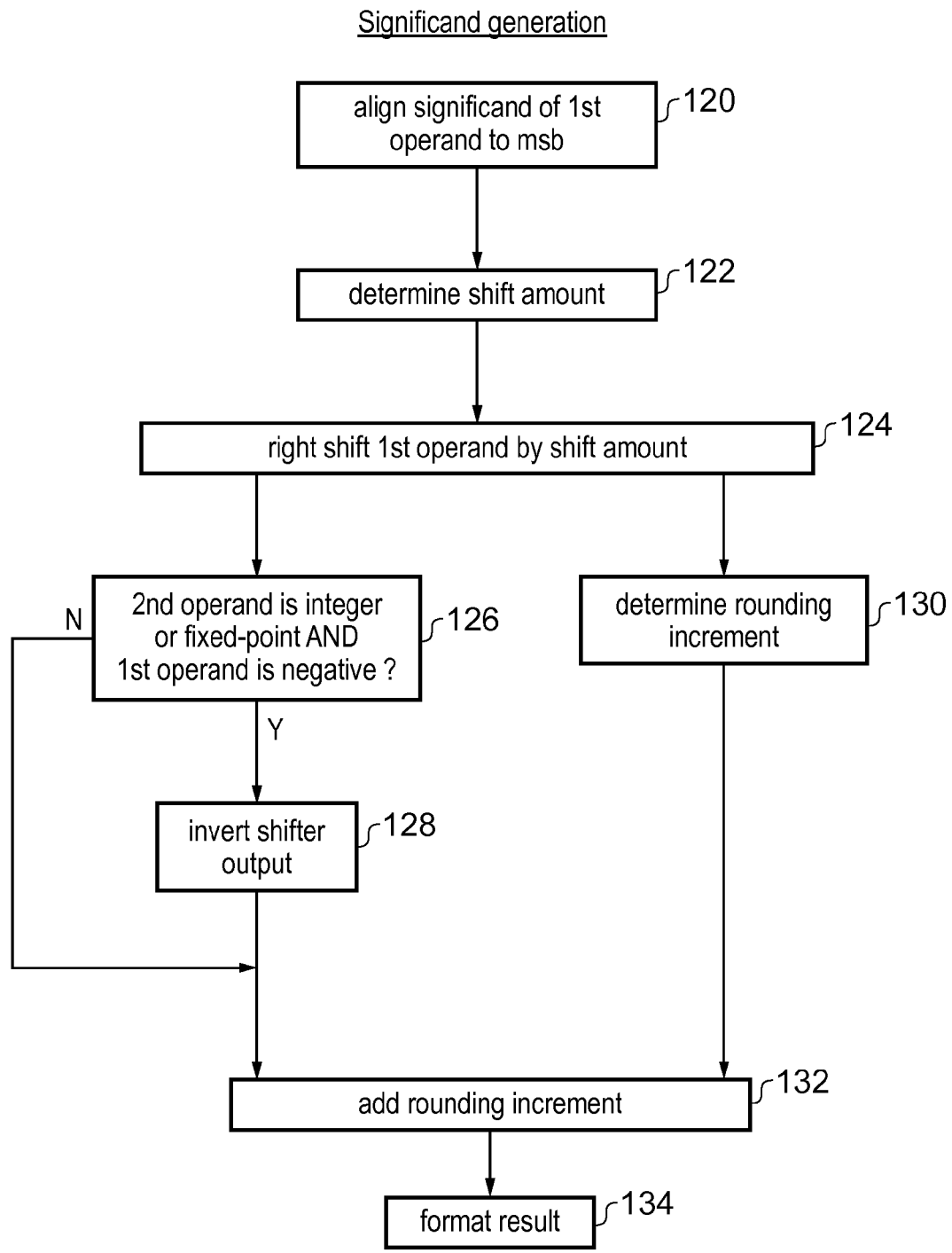
FIG. 6 is a flow diagram illustrating an example of generating a significand of the second value.

FIG. 6 is a flow diagram showing how to generate the significand of the second value. At step 120 the first value is read from the register 22 with its significand placed at the most significant end of the value. At step 122, the first adder 10 determines the shift amount (this is shown in more detail in FIG. 7). At step 124, the shifter 12 right shifts the first value in the register 22 by the shift amount determined by the first adder 10. At step 126, it is determined whether the second value is a fixed-point or integer value and whether the first value is negative. If both are true, then at step 128 the control circuitry 14 inverts the shifter output, while if the second value is a floating-point value or the first value is positive, then step 128 is omitted. Meanwhile at step 130 the control circuitry 14 determines the rounding increment (this is shown in more detail in FIG. 8). At step 132 the adder 16 adds the rounding increment to the shifted significand (or inverted shifted significand if the value is negative). At step 134 the formatting circuitry 18 formats the results in the appropriate format, for example positioning the significand and exponent of a floating-point value at the appropriate locations of the result. The formatting circuitry also sets result flags depending on the result.

Figure 7:
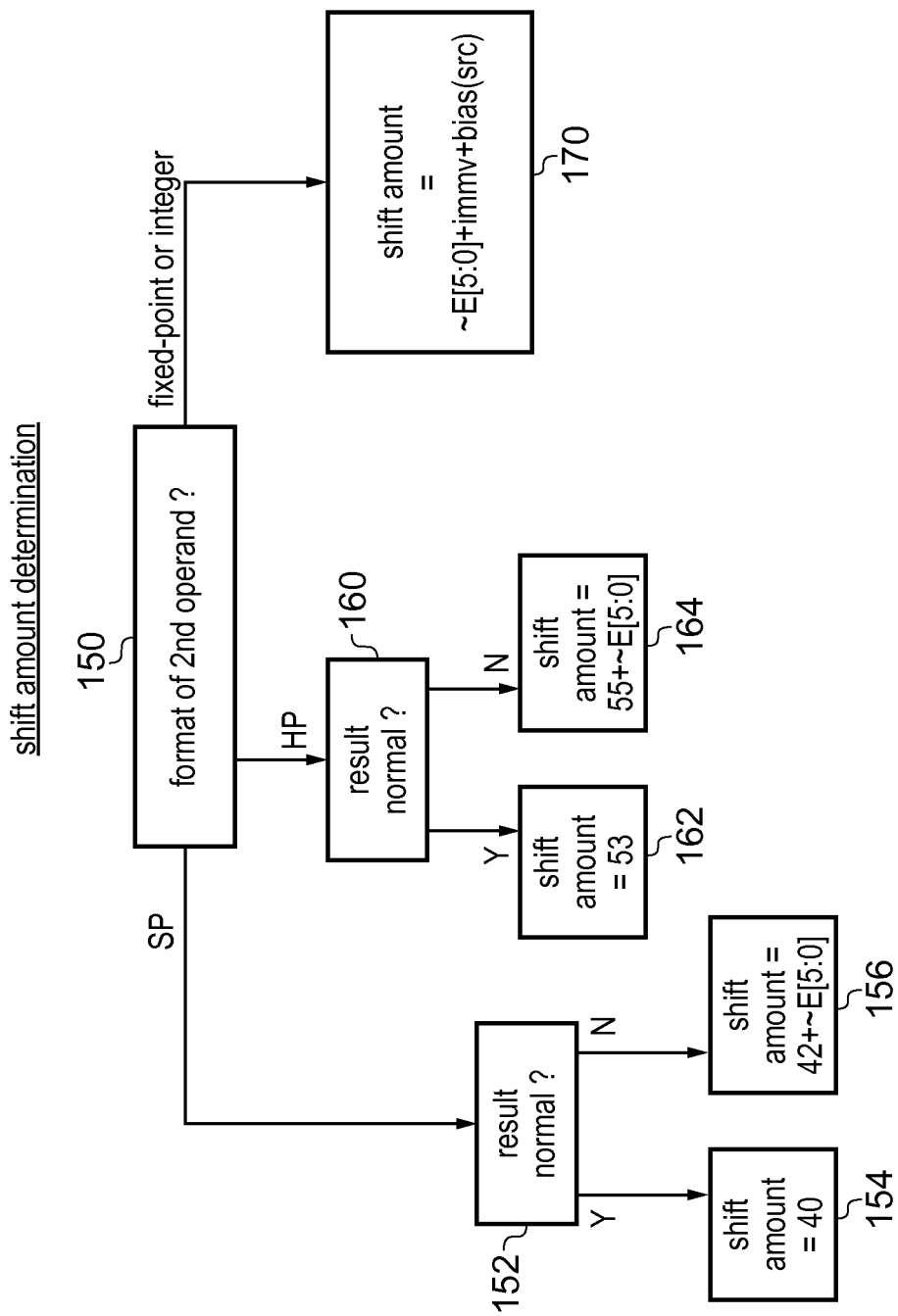
FIG. 7 is a flow diagram illustrating an example of determining a shift amount for shifting the first value.

FIG. 7 is a flow diagram showing how to determine the shift amount at step 122 of FIG. 6. At step 150 the format of the second value is determined based on the conversion control information 20. If the format is a single precision floating-point value then at step 152 it is determined whether the result will be a normal floating-point value in that format. If so, then at step 154 the shift amount is determined equal to 40. On the other hand, if the result will be subnormal in the new format, then at step 156 the shift amount is determined equal to the sum of 42 and a value obtained by inverting the least significant 6 bits of the exponent of the first value.

If the second value is a half precision floating-point value then at step 160 it is determined whether the result will be a normal value in that format. If so, then the shift amount is set to 53 at step 162, while if the result will be subnormal then at step 164 the shift amount is set to the sum of 55 and a value obtained by inverting the least significant 6 bits of the exponent of the first value.

If the second value is a fixed-point or integer or value, then at step 170 the shift amount is determined equal to ~exp[5:0]+immv+bias(src), where ~exp[5:0] is the inverted version of the least significant 6 bits of the exponent, immv represents the number of integer bits in the format of the second value (and equals size(dst)−fbits), and bias(src) represents the bias amount used in the floating-point representation used for the first value.

Figure 8:
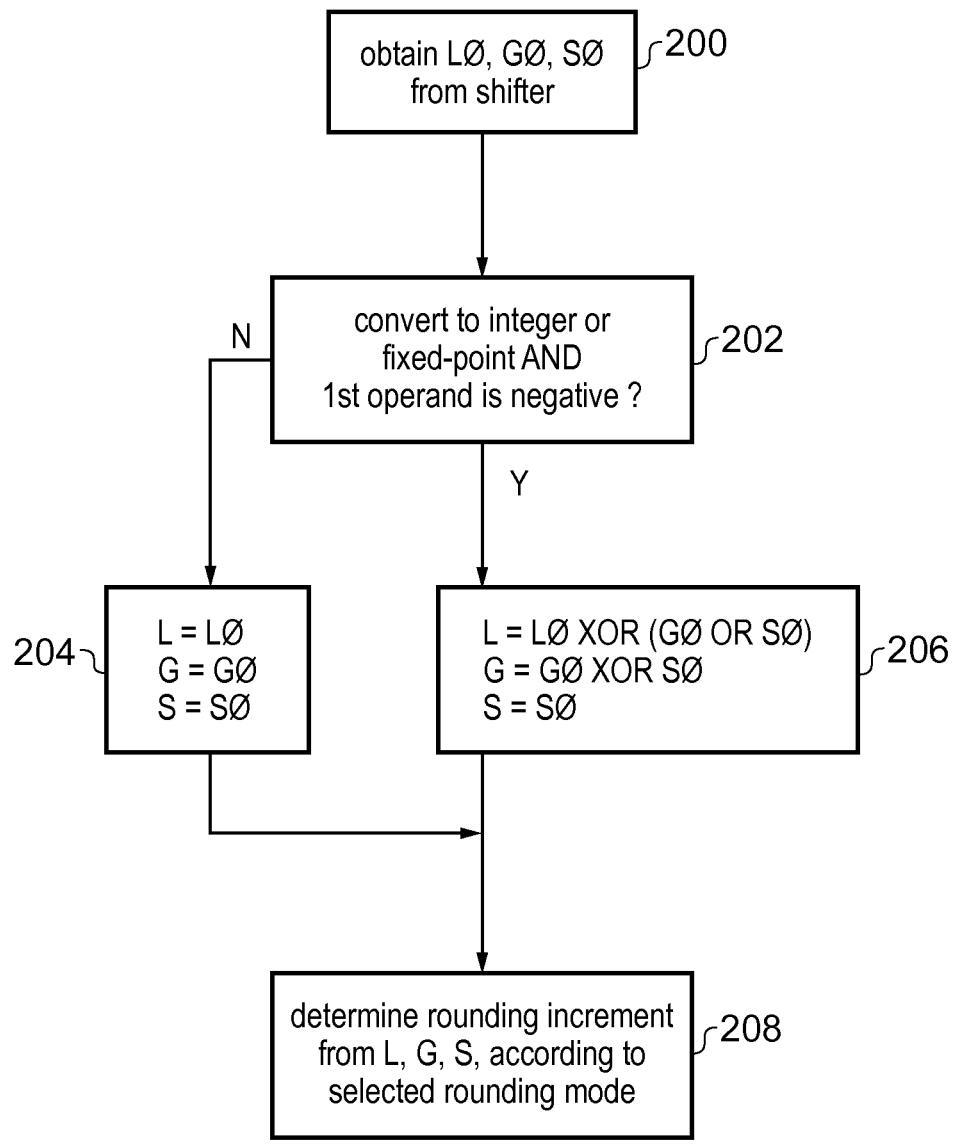
FIG. 8 is a flow diagram illustrating an example of determining a rounding increment for rounding the first value to a number representable using the second value.

FIG. 8 is a flow diagram showing how to determine the rounding increment at step 130 of FIG. 6. At step 200 the control circuitry 14 obtains the least significant bit L0, guard bit G0 and sticky bit S0 from the shifter 12. At step 202 it is determined whether the conversion is to an integer or fixed-point format and the first value is negative. If the second value is a floating-point value or the value is positive, then the least, guard and sticky bits L, G, S used for the rounding are the same as the bits L0, G0, S0 generated by the shifter 12 (step 204). If the conversion is to an integer or fixed-point value and the first value is negative, then at step 206 the bits LGS used for the rounding and determination are set according to: S=S0, G=(G0 ^ S0), L=(L0 ^ (G0|S0)). At step 208, the control circuitry 214 determines the rounding increment from L, G, S based on the rules set out in Table 1 above.

While the examples given above show a limited set of conversions, it will be appreciated that other types of conversions may also be provided. For example, other floating-point formats may use different numbers of bits for the significand and exponent and in this case the shift amount values etc and described above may be adapted for those conversions.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments have been described in detail herein with reference to the accompanying drawings, it is to be understood that the claims are not limited to those precise embodiments, and that various changes, additions and modifications can be effected therein by one skilled in the art without departing from the scope and spirit of the appended claims. For example, various combinations of the features of the dependent claims could be made with the features of the independent claims without departing from the scope of the claims.

We claim:

1. A data processing apparatus comprising:
   floating-point add circuitry to perform a floating-point addition operation for adding or subtracting two floating-point values to generate a result floating-point value; and
   conversion circuitry to perform a conversion operation to convert a first floating-point value into a second value having a different format to the first floating-point value;
   wherein the conversion circuitry is capable of performing the conversion operation where the second value is an integer value or a fixed-point value; and
   the conversion circuitry is physically distinct from the floating-point add circuitry;

wherein the conversion circuitry comprises shift circuitry to shift a significand of the first floating-point value by a shift amount depending on the format of the first floating-point value and the format of the second value to generate a shifted significand.

2. The data processing apparatus according to claim 1, wherein the floating-point add circuitry is capable of performing the floating-point addition operation in M processing cycles, and the conversion circuitry is capable of performing the conversion operation in N processing cycles, where N<M.

3. The data processing apparatus according to claim 1, wherein the conversion circuitry is capable of performing the conversion operation where the second value is a second floating-point value having a different format to the first floating-point value.

4. The data processing apparatus according to claim 3, wherein the second floating-point value has a significand with fewer bits than a significand of the first floating-point value.

5. The data processing apparatus according to claim 4, wherein the conversion circuitry is capable of generating the second floating-point value with a subnormal value if the first floating-point value is smaller than a minimum value representable as a normal value in the format of the second floating-point value.

6. The data processing apparatus according to claim 3, wherein the conversion circuitry comprises exponent generating circuitry to convert an exponent of the first floating-point value to an exponent of the second floating-point value.

7. The data processing apparatus according to claim 1, wherein the conversion circuitry comprises shift control circuitry to determine the shift amount based on at least one control parameter specifying at least one of the format of the first floating-point value and the format of the second value.

8. The data processing apparatus according to claim 1, wherein the conversion circuitry comprises shift control circuitry to determine the shift amount in dependence on an exponent of the first floating-point value if the second value is a second floating-point value and the first floating-point value is smaller than a minimum value representable as a normal value in the format of the second floating-point value.

9. The data processing apparatus according to claim 1, wherein the conversion circuitry comprises shift control circuitry to determine the shift amount in dependence on a parameter representing the position of a radix point of the second value if the second value is a fixed-point value.

10. The data processing apparatus according to claim 1, wherein the conversion circuitry comprises inverting circuitry to invert the significand of the first floating-point value or the shifted significand generated by the shift circuitry if the first floating-point value represents a negative value and the second value is a fixed-point value or an integer value.

11. The data processing apparatus according to claim 1, wherein the conversion circuitry comprises rounding circuitry to round the output of the shift circuitry to a value representable in the format of the second value.

12. The data processing apparatus according to claim 11, wherein the rounding circuitry comprises rounding control circuitry to determine a rounding increment, and an adder to add the rounding increment to the shifted significand to generate a significand of the second value.

13. The data processing apparatus according to claim 12, wherein if the first floating-point value represents a negative value and the second value is a fixed-point value or an integer value, then the adder is configured to add the rounding increment to an inverted version of the shifted significand, and the rounding control circuitry is configured to determine the rounding increment based on a non-inverted output of the shift circuitry.

14. A data processing apparatus comprising:
floating-point adding means for performing a floating-point addition operation for adding or subtracting two floating-point values to generate a result floating-point value; and
conversion means for performing a conversion operation to convert a first floating-point value into a second value having a different format to the first floating-point value;
wherein the conversion means is capable of performing the conversion operation where the second value is an integer value or a fixed-point value; and
the conversion means is physically distinct from the floating-point add means;
wherein the conversion means comprises means for shifting a significand of the first floating-point value by a shift amount depending on the format of the first floating-point value and the format of the second value to generate a shifted significand.

15. A data processing method comprising:
performing a conversion operation to convert a first floating-point value into a second value having a different format to the first floating-point value;
wherein the conversion operation is performed using conversion circuitry which is physically distinct from floating-point add circuitry for performing a floating-point addition operation for adding or subtracting two floating-point values to generate a result floating-point value; and
the conversion circuitry is capable of performing the conversion operation where the second value is an integer value or fixed-point value;
wherein the conversion operation comprises shifting a significand of the first floating-point value by a shift amount depending on the format of the first floating-point value and the format of the second value to generate a shifted significand.

* * * * *